United States Patent [19]

Kishimura

[11] Patent Number: 5,123,998

[45] Date of Patent: Jun. 23, 1992

[54] METHOD OF FORMING PATTERNS

[75] Inventor: Shinji Kishimura, Hyogo, Japan

[73] Assignee: Mitsubishi Denki Kabushiki Kaisha, Tokyo, Japan

[21] Appl. No.: 622,574

[22] Filed: Dec. 5, 1990

[30] Foreign Application Priority Data

Jun. 8, 1990 [JP] Japan ................. 2-150232

[51] Int. Cl.⁵ .................. B44C 1/22; B29C 37/00
[52] U.S. Cl. ...................... 156/643; 156/628;
156/646; 156/659.1; 156/668; 156/904;
427/43.1; 430/313
[58] Field of Search ............. 156/628, 635, 643, 646,
156/659.1, 668, 904; 427/38, 40, 41, 43.1;
430/296, 313, 317

[56] References Cited

U.S. PATENT DOCUMENTS

| | | | |
|---|---|---|---|
| 4,613,398 | 9/1986 | Chiong et al. | 156/628 |
| 4,751,170 | 6/1988 | Mimura et al. | 156/628 X |
| 4,908,298 | 3/1990 | Hefferon et al. | 156/628 X |

FOREIGN PATENT DOCUMENTS

| | | |
|---|---|---|
| 038967 | 3/1984 | European Pat. Off. . |
| 3625340 | 2/1987 | Fed. Rep. of Germany . |
| 3913434 | 10/1990 | Fed. Rep. of Germany . |
| 63-253356 | 10/1988 | Japan . |

OTHER PUBLICATIONS

Nalamasu et al., "A Novel Photooxidative Scheme for Imaging at Polymer Surfaces", SPIE vol. 1086 Advances in Resist Technology and Processing VI (1989), pp. 186-206.

Schellekens et al., "Single Level Dry Developable Resist Systems, Based on Gas Phase Silylation", SPIE vol. 1086 Advances in Resist Technology and Processing (1989), pp. 220-228.

Coopmans et al., "DESIRE: A Novel Dry Developed Resist System", SPIE vol. 631 Advances in Resist Technology and Processing (1986), pp. 34-39.

Primary Examiner—William A. Powell
Attorney, Agent, or Firm—Lowe, Price, LeBlanc & Becker

[57] ABSTRACT

A method of forming patterns for providing satisfactory pattern shapes of high resolution and high sensitivity is disclosed. A resin film comprising hydroxyl groups is formed on a substrate. Deep UV light selectively irradiates the resin film using a desired mask under nitrogen atmospherre. The surface of the non-exposed portion is selectively silylated by hexamethyldisilazane followed by dry development using reactive ion etching comprising $O_2$ gas. In accordance with this method, photo irradiation is carried out under inert gas atmosphere so that crosslinking reaction of the resin film proceeds significantly, with the hydroxyl groups concentration greatly reduced. As a result, there is selectivity in silylation reaction between the exposed portion and the non-exposed portion. The exposed portion and the non-exposed portion is precisely distinguished by dry development. Accordingly, resist patterns of high resolution can be obtained.

14 Claims, 8 Drawing Sheets

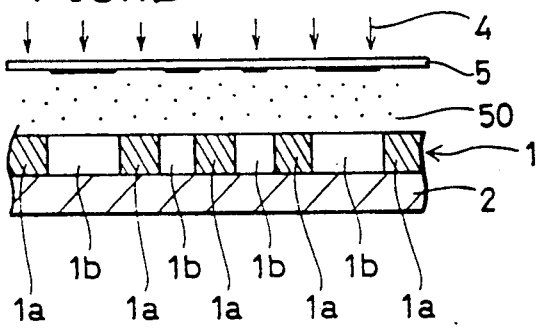
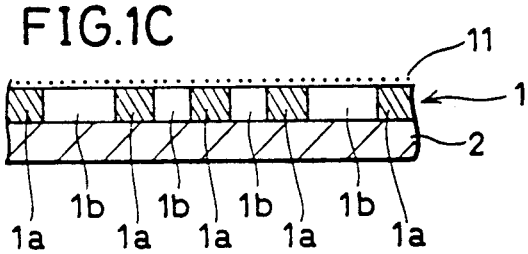
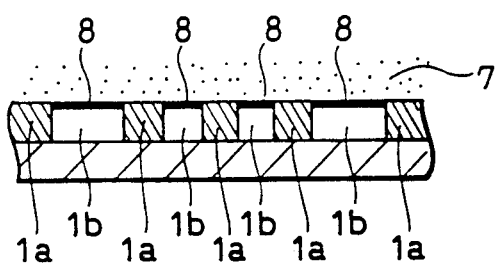
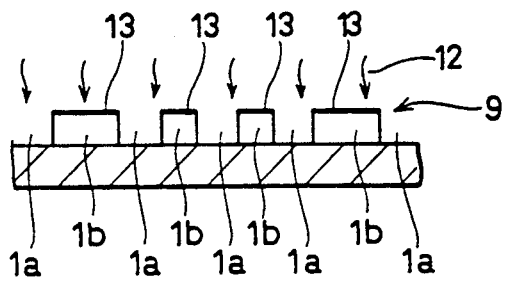

FIG.2A
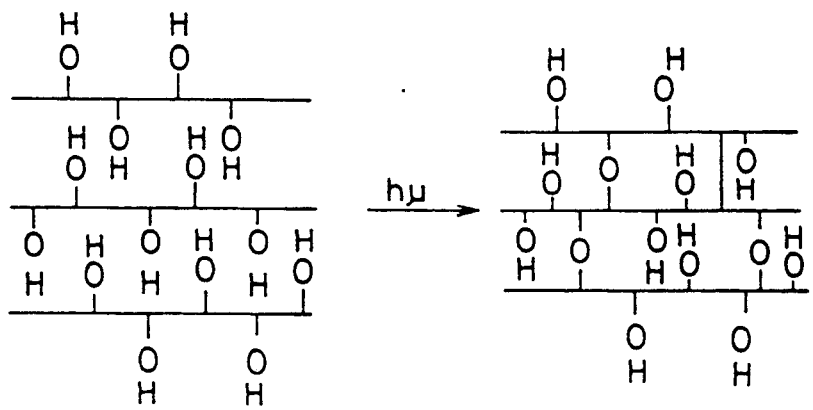
FIG.2B
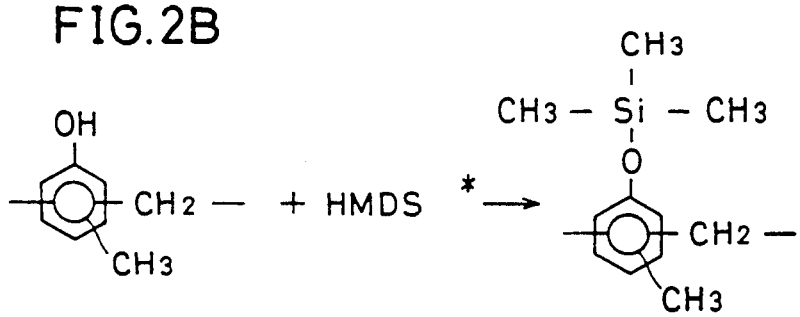
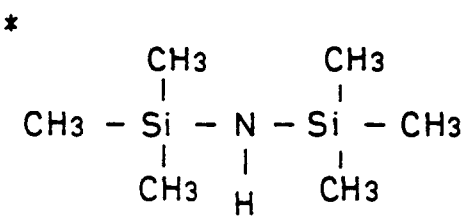

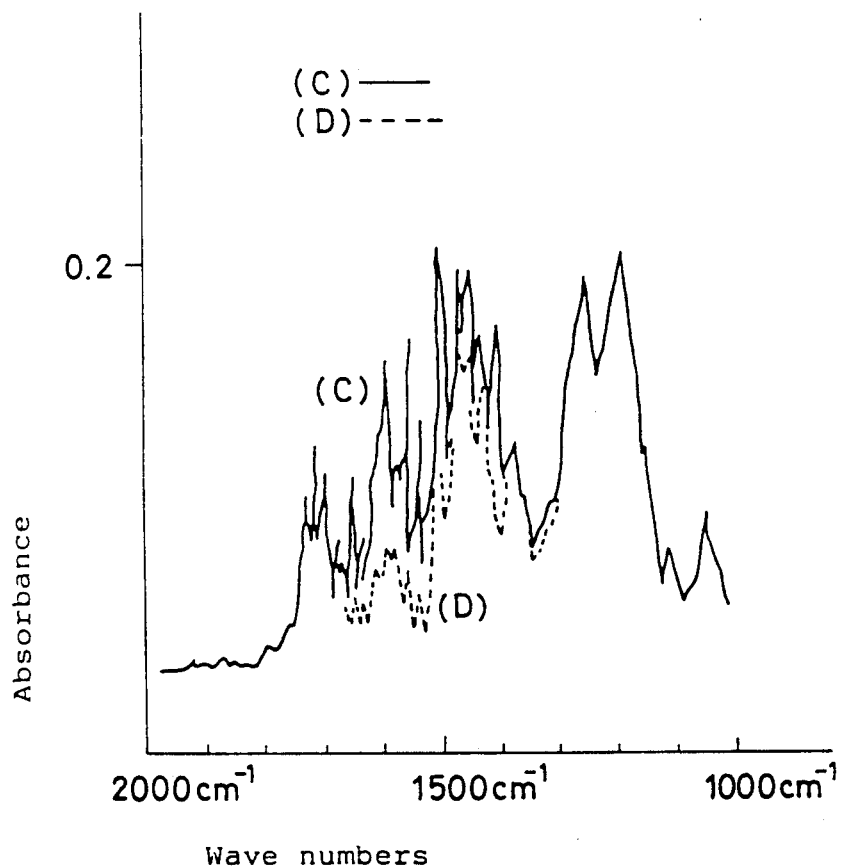

FIG.6A PRIOR ART
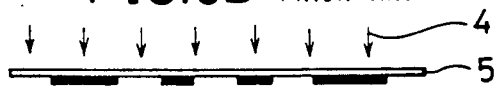
FIG.6B PRIOR ART
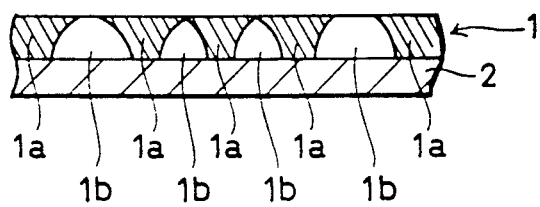
FIG.6C PRIOR ART
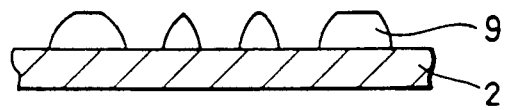
FIG.7 PRIOR ART
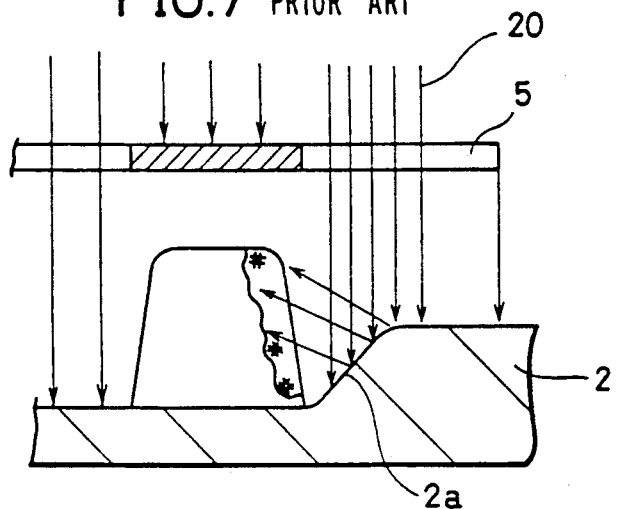

METHOD OF FORMING PATTERNS

BACKGROUND OF THE INVENTION

1. Field of the Invention

The invention relates generally to a method of forming patterns, and more particularly, to a method of forming patterns improved so as to obtain satisfactory pattern shapes of high resolution and high sensitivity.

2. Description of the Background Art

At present, large scale integrated circuits (LSI) represented by 1M or 4M dynamic random access memories (DRAM) are manufactured by selectively irradiating a positive type photo resist constituted by novolak and naphthoquinone diazide with g-line light (wavelength 436 nm) of a mercury lamps, to be followed by pattern formation. The minimum pattern dimension is 1 $\mu$m–0.8 $\mu$m. However, the method of forming patterns of half micron will become necessary in accordance with the increase in the integration level of LSIs, as seen in 16MDRAMs. For this purpose, a study has been made using KrF excimer laser as a light source having a short wavelength in the method of forming patterns.

As a resist used for deep UV light represented by a KrF excimer laser, a positive type photo resist of novolak-naphthoquinone diazide type such as PR1024 (product of MacDERMID INC.), polymethyl methacrylate (PMMA), polyglycidyl methacrylate (PGMA), polychloromethylated styrene (CMS), etc. are proposed. PMMA and PGMA have low sensitivity and low dry etching resistance. CMS has satisfactory dry etching resistance, but the sensitivity thereof is low. The dry etching resistance of PR1024 is satisfactory, and the sensitivity thereof is high in comparison with the above resist. However, its sensitivity is low when compared with exposure by g-line.

A conventional method of forming patterns will be described hereinafter.

FIGS. 6A–6C show the sectional views of a positive type resist of novolak-naphthoquinone diazide type (PR1024, for example) under a conventional method of forming patterns.

Referring to FIG. 6A, PR1024 is applied on a substrate 2 and prebaked to obtain a resist film of 1.0 $\mu$m film thickness.

Referring to FIG. 6B, a KrF excimer laser 4 selectively irradiates resist film 1 with a mask 5. This divides resist film 1 into irradiation regions 1a and non-irradiation regions 1b.

Referring to FIG. 6C, development is carried out using tetra methyl ammonium hydroxide aqueous solution of 2.38 wt. % to obtain resist patterns 9 with irradiation regions 1a removed.

The conventional method of forming patterns explained above has the following problems.

Because the absorption of deep UV light is high in novolak-naphthoquinone diazide type positive resists such as PR1024, light absorption at the surface of resist film 1 is so high that the light will not reach the lower layer portion of resist film 1, as in FIG. 6B. As a result, the sectional shape of resist patterns 9 is tapered upwards to become a triangular shape after development, as in FIG. 6C, leading to a problem that fine patterns could not be obtained precisely.

In a conventional method of forming patterns using not deep UV light but light with a wavelength of 300-500 nm where a step 2a exists in substrate 2, light 20 was scattered by step 2a so that a satisfactory pattern shape could not be obtained (called the notching phenomenon). Similarly, in the case where a film likely to reflect light, such as Al, was formed on substrate 2, satisfactory pattern shapes could not be obtained because of the effect of the reflection of light.

FIGS. 8A–8D show another conventional example of a method of forming resist patterns, which is described in Japanese Patent Laying-Open No. 63-253356.

Referring to FIG. 8A, a resist film 1 of novolak-naphthoquinone diazide type is formed on substrate 2. Next, using mask 5, light having a wavelength of 300-400 nm from high pressure mercury or the like selectively irradiates resist film 1. Crosslinking reaction of the resin occurs at irradiation region 1a by this irradiation of light.

Referring to FIG. 8B, the photo sensitive agent is completely decomposed by irradiating resist film 1 with a light of the same wavelength.

Referring to FIG. 8C, trimethylsilyl dymethyl amine vapor acts on the entire surface of substrate 2. This selectively silylates the portion excluding irradiation regions 1a, that is, the upper layer portion of non-irradiation region 1b, to be converted to a silylated layer 8.

By development of reactive ion etching (RIE) using $O_2$ gas, silylated layer 8 remains as a $SiO_2$ layer 13, whereas irradiation region 1a is removed. This forms resist pattern 9 on substrate 2, as shown in FIG. 8D.

In accordance with the aforementioned other conventional example, it can be seen from FIG. 8C that the selectivity of silylation reaction (the ratio of silylation reaction in the upper layer portion of irradiation region 1a to the silylation reaction in the upper portion of non-irradiation region 1b) is low. This results in the division between the exposed portion and the non-exposed portion to be not clear, as in FIG. 8D, leading to a problem that fine patterns could not be obtained precisely. A light having a wavelength of 300-400 nm was used in this method. Because this light has high transmittance, the problem of notching effect described associated with FIG. 7 exists.

SUMMARY OF THE INVENTION

In view of the foregoing, an object of the invention is to provide a method of forming patterns improved so as to obtain satisfactory pattern shapes of high resolution and high sensitivity.

Another object of the invention is provide a method of forming patterns for obtaining satisfactory pattern shapes by clearly dividing exposed portions and non-exposed portions.

A further object of the invention is to provide a method of forming patterns of satisfactory shapes, even when there are steps in the substrate to be processed.

A still further object of the invention is to provide a method of forming patterns of satisfactory shapes, even when a film such as Al that reflects light is formed on the substrate to be processed.

Yet another object of the invention is to provide a method of forming patterns improved so as to obtain satisfactory pattern shapes of high resolution and high sensitivity, using general resists and general apparatus.

Still another object of the invention is to provide a method of forming patterns that can be adapted to the manufacture of large scale integrated circuits having a high integration level.

Another object of the invention is to provide a method of forming patterns improved so as to obtain satisfactory pattern shapes of high resolution and high sensitivity, by using deep UV light.

A further object of the invention is to provide a method of forming patterns for obtaining satisfactory pattern shapes by forming a $SiO_2$ layer in high selectivity on the upper layer portion of the non-irradiation region of the light to precisely divide exposed portions and non-exposed portions.

In accordance with a first aspect of the method of forming patterns, first a resin film comprising hydroxyl groups is formed on a substrate. Next, radiation selectively irradiates the above mentioned resin film under an atmosphere of inert gas using a desired mask, whereby the resin film is divided into irradiation regions and non-irradiation regions. Then, the surface of the non-irradiation regions of the resin film is organometalized, followed by etching the resin film using plasma comprising $O_2$ gas. This selectively removes the irradiation regions of the resin film.

In the first aspect of the invention, deep UV light having a wavelength of 190–300 nm is preferable as the radiation.

In accordance with a second aspect of the method of forming patterns, a resin film comprising a resin including hydroxyl groups and/or carboxyl groups, and a photo sensitive agent generating carboxyl groups by photo irradiation is formed on a substrate. Next, a first light having a wavelength that generates carboxyl groups from the above mentioned photo sensitive agent irradiates the entire resin film. A second light having a wavelength that crosslinks the resin film selectively irradiates the resin film under an atmosphere of inert gas using a desired mask, to divide the resin film into irradiation regions and non-irradiation regions. Then, the surface of the non-irradiation region of the resin film is organometalized, followed by etching the resin film using plasma including $O_2$ gas. This selectively removes the irradiation regions of the resin film.

It is preferable to use deep UV light having a wavelength of 190–300 nm as the above mentioned second light in the second aspect of the invention.

In accordance with the first aspect of the invention, the resin film is selectively irradiated with radiation under an atmosphere of inert gas. Accordingly, oxygen and moisture included in the air are removed efficiently. This results in the efficient crosslinking reaction shown in FIG. 2A. Therefore, the concentration of hydroxyl groups will become significantly small in the upper layer portion of the irradiation region.

When organometal reagent acts on the resin film of such a state, the organometalization reaction shown in FIG. 2B hardly occurs because the concentration of hydroxyl groups in the upper layer portion of the irradiation region is small. On the other hand, the concentration of hydroxyl groups in the upper layer portion of the non-irradiation region is high because the concentration of hydroxyl groups thereof is maintained at the initial state. Accordingly, the organometalization reaction shown in FIG. 2B occurs efficiently in the upper layer portion of the non-irradiation region.

It can be said that organometalization reaction occurs preferentially at the portion where radiation is not applied. In other words, there is selectivity in the organometalization reaction. The organometalized portion is converted into metal oxide film by plasma comprising $O_2$ gas. Since this metal oxide film serves as a powerful shielding material to $O_2$ gas plasma, the portion not organometalized, i.e. the irradiation region, is removed preferentially by development under $O_2$ gas plasma. That is to say, the exposed portion and the non-exposed portion is precisely distinguished. As a result, resist patterns of high resolution are obtained.

There is an advantage that sensitivity is increased in the case where deep UV light is used as radiation, due to the characteristic of deep UV light being highly absorbed by the resist.

Also owing to the fact that deep UV light is highly absorbed by the resist, crosslinking reaction occurs only at the surface portion of the resist film so that light does not reach the lower layer portion of the resist film. Accordingly, notching will not occur even if there is a step in the substrate. Similarly, the presence of a film such as Al that reflects light on the substrate will not impair the formation of satisfactory pattern shapes.

In accordance with the second aspect of the present invention, a first light having a wavelength that generates carboxyl groups from photo sensitive agent irradiates the entire surface of the resin film, prior to the step of crosslinking in the resin film by irradiation of a second light. With the irradiation of the first light, the photo sensitive agent of naphthoquinone diazide type, for example, decomposes as in FIG. 10 to generate carboxyl groups.

By decomposing the photo sensitive agent in advance, the crosslinking density of the resin of the irradiation region rises at the step of the second light of irradiation. The rise of crosslinking density results in the reduction of concentrations of carboxyl groups and hydroxyl groups in the irradiation region.

When organometal reagent acts on the resin film of such a state, the concentrations of hydroxyl groups and carboxyl groups are so small at the upper layer portion of the irradiation region that the organometalization reaction shown in FIG. 2B hardly occurs.

In the upper layer portion of the non-irradiation region, the concentrations of hydroxyl groups and photo sensitive agent carboxyl groups are high because they remain non-reacted. Therefore, the organometalization reaction shown in FIG. 2B and the organometalization reaction of the carboxyl groups of the photo sensitive agent both occur in the upper layer portion of the non-irradiation region. In this case, the degree of organometalization rises as a function of the concentration of carboxyl groups of the photo sensitive agent, in comparison with the case of the resin only. This results in organometalization reaction preferentially occurring at the portion not irradiated with the second light. That is to say, there is selectivity in the organometalization reaction.

The organometalized portion is converted into a metal oxide film by plasma comprising $O_2$ gas. Since this metal oxide film serves as a powerful shielding material to $O_2$ gas plasma, the portion not organometalized, that is, the irradiation region, is preferentially removed by development of $O_2$ gas plasma. In other words, there is precise division between the exposed portion and the non-exposed portion. As a result, resist patterns of high resolution can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A-1E show sectional views of the steps of an embodiment of the invention.

FIG. 2A shows the crosslinking reaction of a resin comprising hydroxyl groups.

FIG. 2B shows silylation reaction.

FIG. 5 shows the FT-IR absorption spectrum of the resist film before exposure and after exposure.

FIGS. 6A-6C show sectional views of a positive type resist of novolak-naphthoquinone diazide type under a conventional method of forming patterns.

FIG. 7 shows the notching effect observed in the conventional method.

DESCRIPTION OF THE PREFERRED EMBODIMENTS

Figure 3:
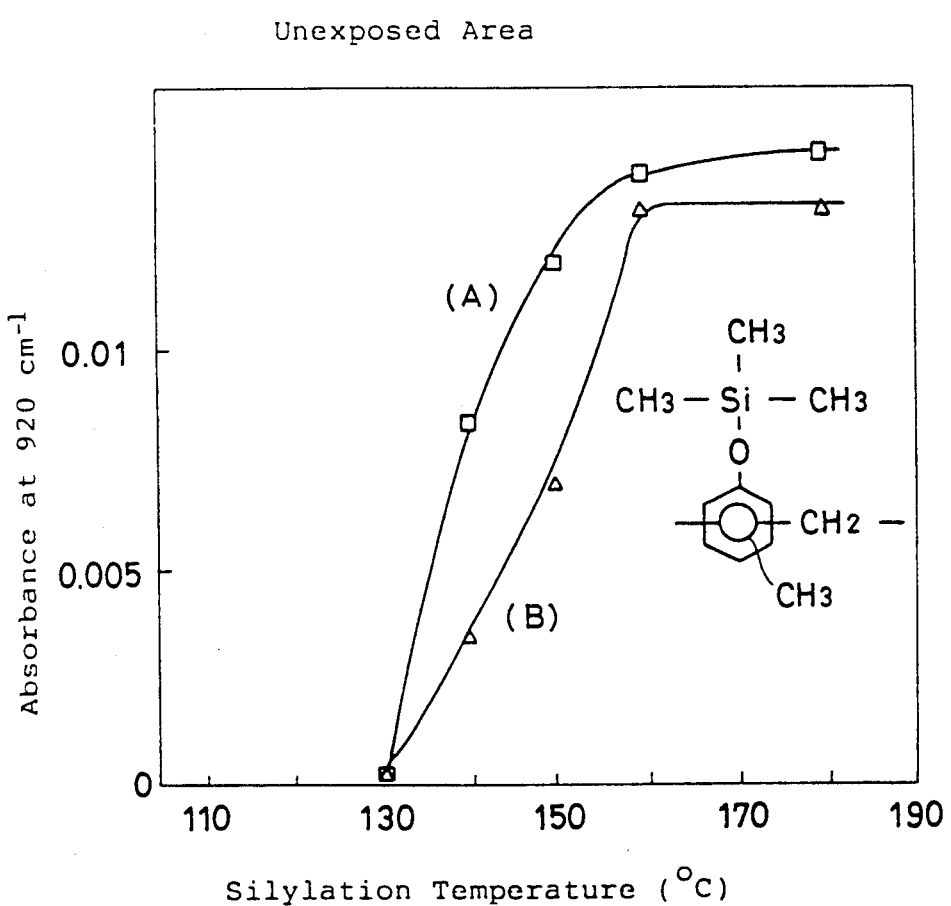
FIG. 3 is a graph comparing the performance of silylation reaction between p-vinylphenol/2-hydroxymethylmethacrylate and novolak resin.

The embodiment of the present invention will be explained hereinafter in reference to the drawings.

FIGS. 1A-1E show sectional views of the steps of an embodiment of the invention.

Referring to FIG. 1A, 1-acetoxy-2-ethoxy ethane solution of p-vinylphenol/2-hydroxyethylmethacrylate (1:1) copolymer (Mw = 10000) is applied by spin coating onto substrate 2. Then this is prebaked for 70 seconds at 110° C. on a hot plate to obtain resist film 1 of 1.2 μm film thickness.

Referring to FIG. 1B, resist film 1 is irradiated selectively by KrF excimer laser light 4 (wavelength of 248 nm) under an atmosphere of nitrogen gas 50 using mask 5. By selective irradiation of KrF excimer laser light 4, resist film 1 is divided into irradiation regions 1a and non-irradiation regions 1b. Crosslinking reaction of the resin shown in FIG. 2A occurs at irradiation region 1a, wherein the concentration of hydroxyl groups decreases.

Figure 9:
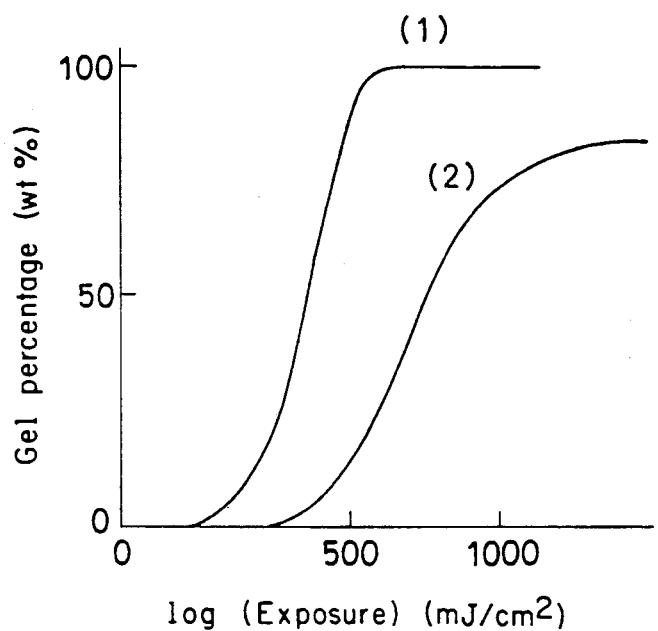
FIG. 9 is a graph showing the relation between exposure dose and gel percentage in the case of photo irradiation under inert gas atmosphere and air atmosphere.

The difference of photo irradiation carried out in air and under nitrogen atmosphere will be explained using a graph. FIG. 9 shows the relation between exposure and gel percentage. The values were obtained using GPC. Curve (1) represents a resin film obtained by photo irradiation under nitrogen gas atmosphere, whereas curve (2) represents a resin film obtained by photo irradiation under air atmosphere. It is seen from this graph that the gel percentage is higher in the case of photo irradiation under nitrogen gas atmosphere. It is presumed that the foregoing is caused for the following reason. The presence of oxygen and moisture in air prevents the crosslinking reaction of the resin shown in FIG. 2A. On the other hand, under nitrogen atmosphere, in other words, by substituting the internal of photo irradiation chamber for nitrogen gas, oxygen and moisture comprised in the air are eliminated. This is considered as the reason for efficient crosslinking reaction of the resin shown in FIG. 2A.

Referring to FIG. 1C, hexamethyldisilazane (referred to as HMDS gas hereinafter) liquid 11 is applied by spin coating on resist film 1. The purpose of spin coating of HMDS liquid 11 onto resist film 1 is to improve the affinity of HMDS for the resist film, and facilitate the silylation reaction which is carried out at a later step. Though HMDS liquid 11 is applied onto resist film 11 by spin coating in the present embodiment, the surface of resist film 1 may be subjected to HMDS vapor.

Referring to FIG. 1D, the processed substrate 2 is placed in a vacuum oven for silylation reaction using HMDS gas 7 under the pressure of 200 Torr at a temperature of 160° C. for 20 minutes. Since the concentration of hydroxyl groups is low at the upper layer portion of irradiation region 1a, the silylation reaction of FIG. 2B hardly occurs. On the other hand, the concentration of hydroxyl groups at the upper layer portion of non-irradiation region 1b is high because hydroxyl groups concentration is maintained at the initial state (no light crosslinking reaction occurs). Accordingly, the silylation reaction of FIG. 2B occurs at the upper layer portion of non-irradiation region 1b to form silylated layer 8 at the upper layer portion of non-irradiation region 1b. In other words, there is selectivity in the silylation reaction.

Referring to FIG. 1E, resist film 1 is developed by reactive ion etching using $O_2$ gas 12. At this time, silylated layer 8 is converted into $SiO_2$ film 13 to serve as a powerful shielding material to $O_2$ gas plasma. Therefore, the portion not silylated, that is, irradiated region 1a, is selectively removed by etching. In other words, the exposed portion and the non-exposed portion is clearly distinguished. As a result, resist pattern 9 of satisfactory resolution is obtained.

Although the case where HMDS is used as the organometal reagent has been described in the above embodiment, the present invention is not limited to HMDS, and silicon compounds such as trimethylsilyldymethylamine, tetrachlorosilane, trimethylchlorosilane, germanium compounds such as trimethylchlorogermanium, tetramethoxygermanium, tri (trimethylgermanium) amine, di(triethoxygermanium) amine, trimethylethoxygermanium, diethyltrimethylgermanium amine, and methyl compounds such as tin, titanium, molybdenum, vanadium, chromium, selenium, may be used preferably.

Particularly, if germanium compound is used, there is an advantage that metal oxide film 13 can be easily peeled off from resist 1b, in reference to FIG. 1E.

In the above embodiment, KrF excimer laser light is used as the radiation for forming patterns, which has a characteristic of being highly absorbed by resist film 1. Accordingly, the sensitivity improves significantly.

Because KrF excimer laser light 4 has a characteristic of being highly absorbed by resist film 1, crosslinking reaction occurs only at the surface portion of resist film 1 so light does not reach the lower layer portion of resist film 1. Therefore, the notching phenomenon shown in FIG. 7 will not occur even if there is a step in substrate 2. Similarly, even if there is a film reflecting light, Al for example, on substrate 2, satisfactory patterning shapes can be obtained.

Although KrF excimer laser light has been taken as an example of deep UV light in the above embodiment, ArF excimer laser (wavelength of 193 nm) may also be used. A light with a wavelength of 190-300 nm is preferred in general. Electron beam may also be preferably used instead of deep UV light.

In the above embodiment, a temperature of 160° C. has been taken as an example for the temperature of silylation. The present invention is not limited to this temperature, and preferable results can be obtained at a temperature within the range of 80-200° C. If the temperature exceeds 200° C., silylation reaction can be seen also in the non-exposed portion, which will degrade the selectivity of silylation reaction, leading to results not satisfactory. If the temperature is below 80° C., silylation reaction does not easily occur.

The pressure of silylation reaction is not limited to 200 Torr shown in the aforementioned embodiment, and preferable results can be obtained at a pressure of within the range of 5-300 Torr. If the pressure exceeds 300 Torr, HMDS gas can not be introduced. If the pressure is below 5 Torr, silylation reaction does not easily occur.

The time of 20 minutes for silylation reaction shown in the above embodiment is by way of example only, and preferable results can be obtained within the time of 10-120 minutes. If the time of silylation reaction exceeds 120 minutes, silylation reaction will occur also in the irradiation region to deteriorate the selectivity of silylation. If the time is less than 10 minutes, silylation reaction will not occur.

The present invention is not limited to p-vinylphenol/2-hydroxyethylmethacrylate copolymer shown in the above embodiment as the resin comprising hydroxyl groups. Novolak resin or p-vinylphenol homopolymer may also be used. FIG. 3 shows the performance of silylation reaction of p-vinylphenol/2-hydroxyethylmethacrylate copolymer and novolak resin. The abscissa represents silylation temperature, whereas the ordinate represents absorbance (infrared absorption assigned to SiO linkage) by FT-IR in 920 cm$^{-1}$. The time of silylation reaction was 60 minutes. Curve (A) shows p-vinylphenol/2-hydroxyethylmethacrylate copolymer, whereas curve (B) shows novolak resin. It can be seen from the graph that p-vinylphenol/2-hydroxyethylmethacrylate copolymer is silylated at a temperature lower than that of novolak resin.

In the above embodiment, p-vinylphenol/2-hydroxyethylmethacrylate copolymer has been taken as an example of p-vinylphenol copolymer. However, the present invention is not limited to this and p-vinylphenol/methylmethacrylate copolymer, p-vinylphenol/styrene copolymer, or p-vinylphenol/phenyl maleimide copolymer may also be used.

Although p-vinylphenol/2-hydroxyethylmethacrylate has been taken as an example for the pattern formation material in the above embodiment, photo sensitive agent may also be comprised thereof.

Using MCPR2000H (a product of MITSUBISHI KASEI CORPORATION) as the resist which is naphthoquinone diazide-novolak type resin resist, and KrF excimer laser light as the light source, the results of the method in accordance with the first embodiment shown in FIGS. 1A-1F and a conventional method shown in FIGS. 6A-6C (comparative example 1) are summarized in Table 1. Comparative example 2 in Table 1 shows the results of the method of FIGS. 1A-1F, in the case where photo irradiation is carried out not in nitrogen, but in air.

TABLE 1

| | Practical Sensitivity (mJ/cm$^2$) | Practical Resolution (μmL/S) |
|---|---|---|
| Embodiment | 80-150 | 0.3 |

TABLE 1-continued

| | Practical Sensitivity (mJ/cm$^2$) | Practical Resolution (μmL/S) |
|---|---|---|
| Example 1 Comparative Example 1 | 1000-4000 | 0.6 |
| Comparative Example 2 | 100-300 | 0.3 |

FIGS. 4A-4E show sectional views of the steps of another embodiment of the invention.

Although a special pattern formation material such as p-vinylphenol/2-hydroxyetylmethacrylate copolymer is used in the aforementioned embodiment, the present invention also has the advantage that satisfactory resist patterns of high resolution can be attained using general pattern formation materials and general manufacturing apparatus.

Figure 4A:
FIGS. 4A-4E show sectional views of the steps of another embodiment of the present invention.

Referring to FIG. 4A, MCPR 3000 (a product of MITSUBISHI KASEI CORPORATION) which is naphthoquinone diazide-novolak type resin resist is applied by spin coating onto substrate 2. This is prebaked for 70 seconds on a hot plate at 100° C. to obtain resist film 1 of 1.2 μm film thickness.

Figure 4B:
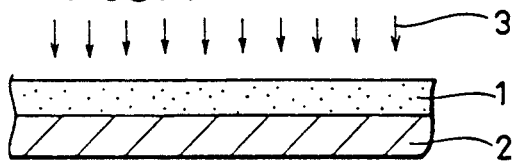
Figure 10:
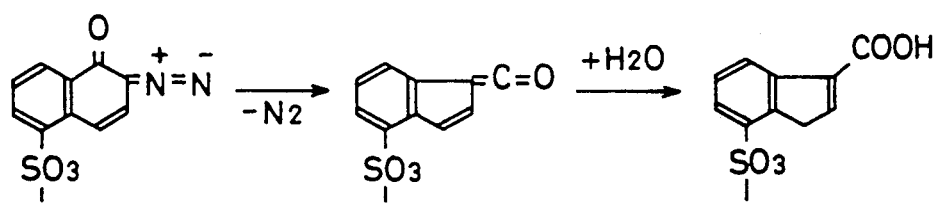
FIG. 10 shows the reaction equation of the decomposition of naphthoquinone diazide groups.

Referring to FIG. 4B, g-line light (wavelength of 436 nm) 3 irradiates all over resist 1. The exposure at this time is 400 mJ/cm$^2$. By this irradiation of g-line light 3, naphthoquinone diazide in MCPR 3000 decomposes as shown in FIG. 10 to generate carboxyl groups.

FIG. 5 is the FT-IR absorption spectrum of the resist film before exposure and after exposure. Curve (C) is a spectrum of the non-exposed resist, while curve (D) is the spectrum of the resist after exposure. The absorption of 1550-1600 cm$^{-1}$ is assigned to diazide linkage. It can be seen from FIG. 5 that the absorbance of 1550-1600 cm$^{-1}$ becomes low after exposure, and naphthoquinone diazide groups is decomposed. The reason why the photo sensitive agent is decomposed in advance will be explained later.

Figure 4C:
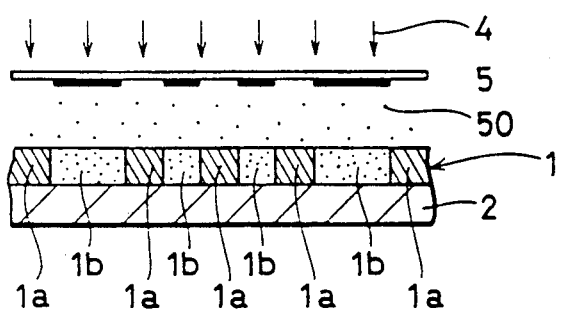

Referring to FIG. 4C, KrF excimer laser light 4 selectively irradiates resist film 1 using mask 5 under the atmosphere of nitrogen gas 50. By the selective irradiation of KrF excimer laser light 4, resist film 1 is divided into irradiation regions 1a and non-irradiation regions 1b. Crosslinking reaction of the resin occurs at irradiation region 1a, as shown in FIG. 2A. Hydroxyl groups in the resin also react with the carboxyl groups because the photo sensitive agent is decomposed in advance so as to generate carboxyl groups, as mentioned above. As a result, crosslinking density rises at irradiation region 1a, and the concentration of hydroxyl groups becomes low. Meanwhile, hydroxyl groups remain at non-irradiation region 1b, with carboxyl groups generated from the photo sensitive agent also remaining.

Figure 4D:
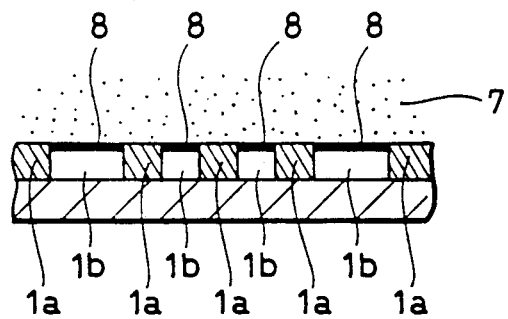

Substrate 2 having resist film 1 of such a state is placed in a vacuum oven for silylation reaction by HMDS gas 7 under the pressure of 200 Torr for 30 minutes at a temperature of 120° C., in reference to FIG. 4D. Prior to this silylation reaction, wetting the surface portion of resist film 1 with HMDS liquid will enhance the silylation reaction, as shown in FIG. 1C.

During this silylation reaction step, the concentration of hydroxyl groups in the upper layer portion of irradiation region 1a is so small that the silylation reaction shown in FIG. 2B hardly occurs. The concentration of hydroxyl groups and carboxyl groups of the photo sensitive agent at the upper layer portion of non-irradiation region 1b are high because they remain unreacted. Therefore, at the upper layer portion of non-irradiation region 1b, the silylation reaction of FIG. 2B and the silylation reaction of carboxyl groups of the photo sensitive agent occur to form silylated layer 8. Silylation reaction occurs preferentially at the upper layer portion of non-irradiation region 1b. That is to say, there is selectivity in the silylation reaction.

Figure 4E:
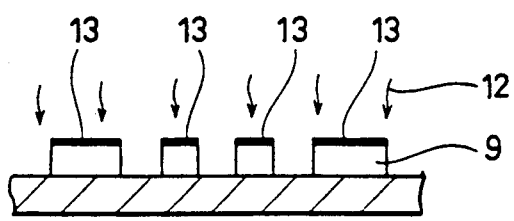
Figure 8A:
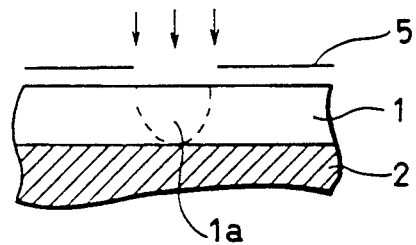
FIGS. 8A-8D are sectional views of another conventional example of the method of forming resist patterns.
Figure 8B:
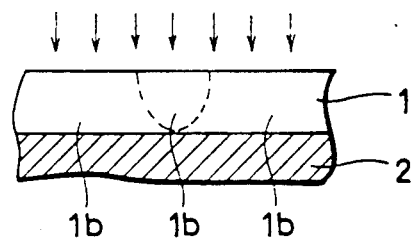
Figure 8C:
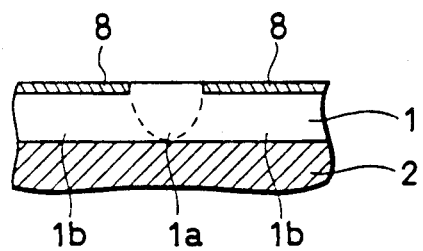
Figure 8D:
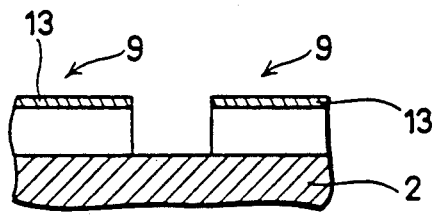

Referring to FIG. 4E, resist film 1 is developed by reaction ion etching using $O_2$ gas 12. The condition of $O_2$ RIE was 600 W, 1 Pa, and 10 sccm. Silylated layer 8 is converted into $SiO_2$ film 13 at this time to serve as a powerful shielding material to $O_2$ gas plasma. Accordingly, the portion not silylated, that is, irradiation region 1a, is preferentially removed by etching. In other words, the exposed portion and non-exposed portion is precisely divided. As a result, resist pattern 9 of satisfactory resolution is obtained.

Using MCPR3000 (a product of MITSUBISHI KASEI CORPORATION) as the resist, and KrF excimer laser light as the light source, the results of the method in accordance with the second embodiment shown in FIGS. 4A-4E and a conventional method shown in FIGS. 8A-8E (comparative example 3) are summarized in Table 2. Comparative example 4 in Table 2 shows the results of the method of FIGS. 4A-4E, in the case where photo irradiation is carried out not in nitrogen, but in air.

TABLE 2

| | Practical Sensitivity (mJ/cm$^2$) | Practical Resolution (μmL/S) |
|---|---|---|
| Embodiment Example 2 | 150-300 | 0.3 |
| Comparative Example 3 | 1000-2000 | 1.0 |
| Comparative Example 4 | 200-500 | 0.35 |

KrF excimer laser light used in the above mentioned embodiment as the light for pattern formation has a characteristic of being highly absorbed by the resist. Accordingly, there is the advantage that the sensitivity is improved.

In the above embodiment, g-line is used as the light for decomposing photo sensitive agent. However, the invention is not limited to this and a light having a wavelength of 300-450 nm is preferably used.

The light for pattern formation is not limited to KrF excimer laser light used in the embodiment. ArF excimer laser light may also be used. In general, a light having a wavelength of 190-500 nm, particularly a wavelength of 190-300 nm is preferred. Also electron beam may preferably be used.

Although novolak resin is used as the pattern formation material in the above embodiment, similar effects may be implemented using p-vinylphenol polymer, polymetylmethacrylate or polyglycidylmethacrylate having monomer copolymerized including metha acrylic acid or acrylic acid and the like.

The temperature of silylation is not limited to 120° C. as described in the above embodiment. Preferable results can be obtained at a temperature within the range of 80°-160° C.

Although a pressure of 200 Torr has been taken as an example for silylation in the above embodiment, the present invention is not limited to this value. Preferable results can be obtained at a pressure within 5-200 Torr.

The time of 30 minutes of silylation shown in the above embodiment is by way of example only, and preferable results can be obtained within the range of 30-120 minutes.

In the above embodiment, nitrogen has been taken as an example for inert gas. The present invention is not limited to nitrogen, and similar effects can be implemented with inert gas such as herium, neon, argon, krypton, xenon and hydrogen.

In accordance with the first aspect of the present invention, radiation selectively irradiates the resin film under an atmosphere of inert gas. Next, the surface of the non-exposed portion is selectively organometalized by the organometal reagent, followed by development using plasma including $O_2$ gas. This implementation precisely divides the exposed portion and the non-exposed portion to obtain resist patterns of high resolution.

In accordance with the second aspect of the invention, the pattern formation material comprising resin including the desired hydroxyl groups and/or carboxyl groups, and photo sensitive agent generating carboxyl groups by photo irradiation is applied to the substrate. Prior to irradiation of light for forming patterns, light having a wavelength necessary to decompose the photo sensitive agent irradiates the entire surface to generate carboxyl groups from the photo sensitive agent. Then, light for forming patterns is selectively irradiated using a mask under inert gas atmosphere. The surface of the non-exposed portion is selectively organometalized by the organometal reagent, followed by development using plasma including $O_2$ gas. This implementation precisely divides the exposed portion and the non-exposed portion to obtain resist patterns of high resolution.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming patterns comprising the steps of:
    forming a resin film including a hydroxyl group on a substrate,
    selectively directing radiation on said resin film using a desired mask under an atmosphere of inert gas to divide said resin film into irradiation regions and non-irradiation regions,
    organometalizing the surface of the non-irradiation region of said resin film using an organometal reagent, and
    etching said resin film by plasma including $O_2$ gas to selectively remove the irradiation region of said resin film.

2. The method according to claim 1, wherein said inert gas comprises nitrogen gas.

3. The method according to claim 1, further comprising the step of wetting the surface of said resin film with a liquid of said organometal reagent for improving affinity of said resin film for said organometal reagent, prior to the step of said organometalization.

4. The method according to claim 1, further comprising the step of subjecting the surface of said resin film to vapor of said organometal reagent for improving affinity of said resin film for said organometal reagent, prior to said step of organometalization.

5. The method according to claim 1, wherein said radiation comprises deep UV light of a wavelength of 190-300 nm.

6. The method according to claim 1, wherein said organometal reagent comprises silicon compounds.

7. The method according to claim 1, wherein said organometal reagent comprises germanium compounds.

8. The method according to claim 1, wherein the step of organometalizing the surface of the non-irradiation region of said resin film is carried out under the conditions at a temperature of 80°-200° C., a pressure of 5-300 Torr, and a time period of 10-120 minutes.

9. The method according to claim 1, wherein said resin comprising hydroxyl groups is a resin selected from the group consisting of said novolak resin, p-vinylphenol polymer, and p-vinylphenol copolymer.

10. The method according to claim 1, wherein said resin film comprises a photo sensitive agent for generating carboxyl groups by photo irradiation.

11. A method of forming patterns comprising the steps of:

forming a resin film including a resin having at least one group selected from a hydroxyl group and a carboxyl group, and a photo sensitive agent generating a carboxyl group by photo irradiation on a substrate, irradiating the entire surface of said resin film with a first light having a wavelength which generates a carboxyl group from said photo sensitive agent, irradiating said resin film with a second light having a wavelength that crosslinks said resin film using a desired mask under inert gas atmosphere so that said resin is divided into irradiation regions and non-irradiation regions, organometalizing the surface of the non-irradiation region of said resin film, and etching said resin film by plasma including $O_2$ so that the irradiation region of said resin film is selectively removed.

12. The method according to claim 11, wherein said first light comprises light having a wavelength of 300-450 nm.

13. The method according to claim 11, wherein said second light comprises deep UV light having a wavelength of 190-300 nm.

14. The method according to claim 11, wherein the step of organometalizing the surface of the non-irradiation region of said resin film is carried out under the conditions at a temperature of 80-200° C., a pressure of 5-300 Torr, and a time period of 10-120 minutes.

* * * * *